(12) United States Patent
Hassanein et al.

(10) Patent No.: US 7,180,082 B1
(45) Date of Patent: Feb. 20, 2007

(54) METHOD FOR PLASMA FORMATION FOR EXTREME ULTRAVIOLET LITHOGRAPHY-THETA PINCH

(75) Inventors: Ahmed Hassanein, Naperville, IL (US); Isak Konkashbaev, Bolingbrook, IL (US); Bryan Rice, Hillsboro, OR (US)

(73) Assignee: The United States of America as represented by the United States Department of Energy, Washington, DC (US)

( * ) Notice: Subject to any disclaimer, the term of this patent is extended or adjusted under 35 U.S.C. 154(b) by 45 days.

(21) Appl. No.: 11/066,655

(22) Filed: Feb. 22, 2005

Related U.S. Application Data (60) Provisional application No. 60/545,492, filed on Feb. 19, 2004.

(51) Int. Cl.
*A61N 5/06* (2006.01)
*G01J 3/10* (2006.01)
*H05G 2/00* (2006.01)

(52) U.S. Cl. ................................. 250/504 R
(58) Field of Classification Search ............. 250/504 R
See application file for complete search history.

(56) References Cited

U.S. PATENT DOCUMENTS 3,911,318 A * 10/1975 Spero et al. .................. 315/39
6,408,052 B1 * 6/2002 McGeoch .................... 378/119

* cited by examiner

*Primary Examiner*—Jack Berman
*Assistant Examiner*—Jennifer Yantorno
(74) *Attorney, Agent, or Firm*—Mark F. LaMarre; Mark P. Dvorscak; Paul A. Gottlieb (57) ABSTRACT

A device and method for generating extremely short-wave ultraviolet electromagnetic wave, utilizing a theta pinch plasma generator to produce electromagnetic radiation in the range of 10 to 20 nm. The device comprises an axially aligned open-ended pinch chamber defining a plasma zone adapted to contain a plasma generating gas within the plasma zone; a means for generating a magnetic field radially outward of the open-ended pinch chamber to produce a discharge plasma from the plasma generating gas, thereby producing a electromagnetic wave in the extreme ultraviolet range; a collecting means in optical communication with the pinch chamber to collect the electromagnetic radiation; and focusing means in optical communication with the collecting means to concentrate the electromagnetic radiation.

13 Claims, 5 Drawing Sheets

SCHEMATIC ILLUSTRATION OF EXTERNAL CIRCUIT
AND CURRENT FLOW FOR THETA-PINCH

FIG. 1

SCHEMATIC ILLUSTRATION OF EXTERNAL CIRCUIT
AND CURRENT FLOW FOR THETA-PINCH

FIG. 2

SCHEMATIC OF THETA-PINCH DEVICE AS AN ADVANCED EUVL LIGHT SOURCE. IN THIS THRUST A PROGRAM OF ADVANCED MATERIALS MIRRORS COMPATIBLE WITH θ-PINCH.

FIG. 3
CLASSICAL THETA-PINCH

FIG. 4
MIRROR TRAP TYPE THETA-PINCH

FIG. 5
PINCH TIME EVOLUTION

METHOD FOR PLASMA FORMATION FOR EXTREME ULTRAVIOLET LITHOGRAPHY-THETA PINCH

This application claims priority from provisional application 60/545,492 filed Feb. 19, 2004.

CONTRACTUAL ORIGIN OF INVENTION

The United States Government has rights in this invention pursuant to Contract No. W-31-109-ENG-38 between the U.S. Department of Energy and the University of Chicago representing Argonne National Laboratory and under other contracts with Argonne.

FIELD OF THE INVENTION

This invention relates to an improvement in Extreme Ultraviolet Lithography (EUVL). More specifically this invention relates to a method and apparatus for producing the 13.5 nm wavelength radiation for Extreme Ultra Violet Lithography (EUVL).

BACKGROUND OF THE INVENTION

Description of Related Art

The current process for chip making is called deep-ultraviolet lithography (DUV), which is a photography-like technique that focuses light through lenses to expose the raw circuit material and the accompanying photomask. Subsequent etching and chemical processing carves circuit patterns on the circuit material, such as a silicon wafer. The key to creating more compact and powerful microprocessors is the size of the light's wavelength. The shorter the wavelength of light that is used, the more transistors that can be etched onto a given area of a silicon wafer's surface. As of 2001, deep-ultraviolet lithography used a wavelength of 230 nanometers (nm) and it is anticipated that that DUV technology will permit features as small at about 100 nm. The next generation of lithography under development is known as Extreme Ultraviolet Lithography (EUVL).

EUVL uses a light source with a wavelength of 13.5 nanometers (nm). This wavelength may be obtained from plasma-based systems using a variety of technological approaches. In U.S. Pat. No. 6,493,423, a plasma generating gas is exposed to a high energy pulsed laser producing EULV in the desired range. The plasma-generating gas may be a gas such as xenon. When the laser hits the xenon gas, it heats the gas up and creates plasma. Once the gas is plasmatized, electrons are emitted from the plasma and the plasma radiates light at 13.5 nm. The problem with creating the plasma with a laser is that lasers of sufficient power are expensive, both to purchase and to operate. It order to develop EUVL commercially, is will be necessary to provide an inexpensive source of plasma.

For many years, it has been known that x-rays and high energy ultraviolet radiation could be generated by a plasma source referred to as z-pinch. In a z-pinch plasma source an electric current passes between two electrodes, through a plasma generating gas, in one of several possible configuration. The magnetic field created by the flowing electric current accelerates the electrons and ions in the plasma into a tiny volume with sufficient energy to cause substantial stripping of outer electrons from the ions and a consequent production of x-rays and high energy ultraviolet radiation. Typical prior art plasma z-pinch devices, such as presented in Asmus et al., U.S. Pat. No. 4,889,605 and Stromberg et al., U.S. Pat. No. 4,899,355, can generate large amounts of radiation suitable for proximity x-ray lithography. However, these devices are limited in repetition rate due to large per pulse electrical energy requirements, and short lived internal components. The stored electrical energy requirements for these systems range from 1 kJ to 100 kJ. The repetition rates typically did not exceed a few pulses per second. Further, the problem with electrodes, in the plasma environment, is that electrodes, particularly the anode, suffer from a high erosion rate due to particle and heat fluxes resulting in low efficiency and short lifetimes.

One of the main obstacles now in achieving EUVL commercial goals in discharge produced plasma (Hereinafter referred to as "DPP") devices is electrode erosion at the required high power necessary for high volume manufacturing (Hereinafter referred to as "HVM"). Existing facilities are based on 50 years old traditional ideas when first devices for production of 14 MeV neutrons for thermonuclear fusion research were studied. However, these facilities were never intended for use as powerful machines operating at high frequency. Only in recent years has there been research from various groups to develop devices to obtain 100–200 W radiation sources and now meet serious problem with material erosion. This is due to the very small efficiency, $\zeta$ to transfer stored energy in 13.5 nm radiation: as $\zeta \approx 0.1\%$ the required electric power should be about 100 kW. If the plasma-facing component (PFC) surface has an area less 100 cm$^2$ the heat load onto surface exceeds 1 kW/cm$^2$ which is difficult to remove by conventional methods as it is well studied in fusion reactor and space research investigations.

SUMMARY OF THE INVENTION

An object of this invention is to provide a method and apparatus for generating electromagnetic radiation in the range of 13.5 nm that does not degrade or erode the electrode material. An additional objection of this invention is to provide a method and apparatus which eliminates the need for an electrode in the light generation process.

These and other objectives of the invention, which will become apparent from the following description, have been achieved by a novel method and apparatus that utilizes a theta-pinch ($\theta$-pinch) device as a means to generate and contain the plasma needed to provide the 13.5 nm wavelength light source for EUVL. A theta-pinch device is a magnetic device used for the magnetic confinement, heating and compressing of plasmas.

The instant invention is directed to an electrodeless device for generating/producing extremely short-wave ultraviolet electromagnetic wave, comprising: an axially aligned open-ended pinch chamber defining a plasma zone adapted to contain a plasma generating gas within the plasma zone; a plasma generating gas within the plasma zone; a means for generating a magnetic field radially outward of the open-ended pinch chamber to produce a discharge plasma from the plasma generating gas, thereby producing a electromagnetic wave in the extreme ultraviolet range; collecting means in optical communication with the pinch chamber to collect the electromagnetic radiation; and focusing means in optical communication with the means for collecting. The plasma generating gas is selected from the group consisting of xenon, vaporized tin and vaporized lithium. The means for generating the magnetic field will produce a magnetic field of from about 7.5 kG to about 10 kG. Typically, the plasma of this invention is generated at a temperature from about 20 eV to about 40 eV. The extremely short-wave ultraviolet electromagnetic wavelength produced by this device is from about 10 nm to about 20 nm and preferably about 13.5 nm. The collecting means is normally located adjacent to the ends of the open-ended pinch chamber. The electromagnetic radiation is directed to the circuit material and associated photomask by appropriate means.

The method of this invention for generating/producing extremely short-wave ultraviolet electromagnetic wave without the use of electrode, comprising: providing an open-ended pinch chamber defining a plasma zone; providing a plasma generating gas within the plasma zone; generating a magnetic field radially outward of the open-ended pinch chamber to produce a discharge plasma from the plasma generating gas, thereby producing a electromagnetic wave in the extreme ultraviolet range, said electromagnetic wave emanating from the ends of the plasma zone; and collecting/focusing the electromagnetic wave emanating from the ends of the pinch chamber to collect the electromagnetic radiation. Further, the invention comprises focusing the electromagnetic wave to provide a coherent beam of electromagnetic radiation. Finally, the electromagnetic wave is directed to a circuit material and associated photomask by appropriate means.

BRIEF DESCRIPTION OF THE SEVERAL VIEWS OF DRAWINGS

With this description of the invention, a detailed description follows with reference being made to the accompanying figures of drawings which form part of the specification, in which like parts are designated by the same reference numbers, and of which.

The invention is not limited in its application to the details and construction and arrangement of parts illustrated in the accompanying drawings since the invention is capable of other embodiments that are being practiced or carried out in various ways. Also, the phraseology and terminology employed herein are for the purpose of description and not of limitation.

DETAILED DESCRIPTION OF THE INVENTION

θ-Pinch

Figure 1:
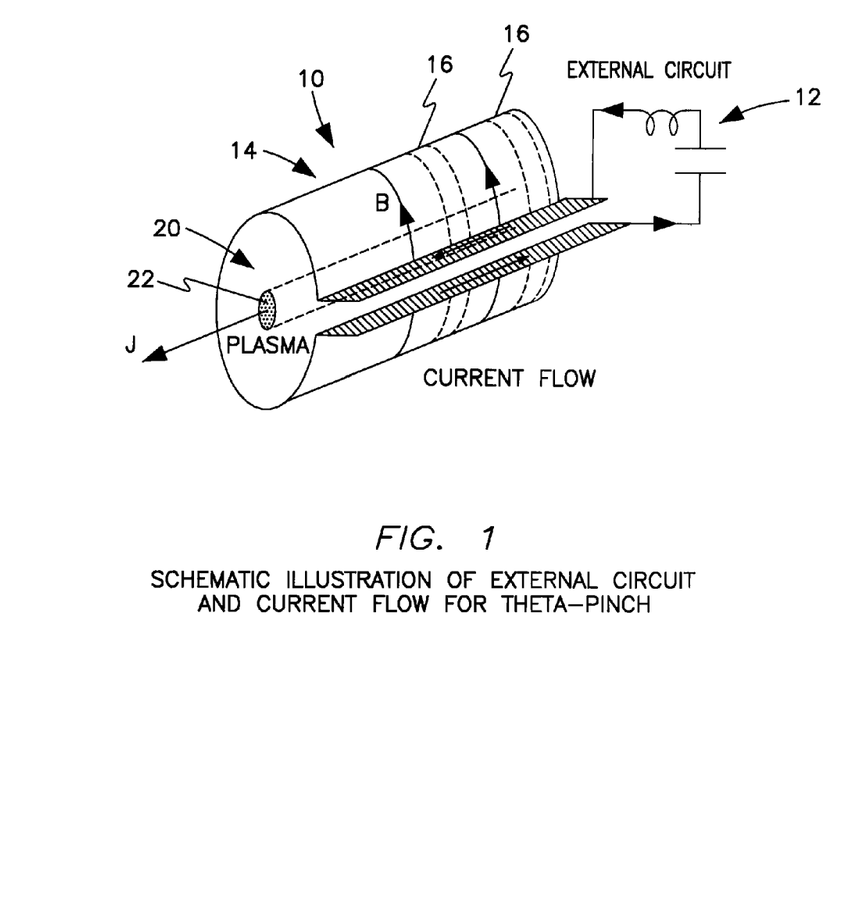
FIG. 1 is a schematic of theta-pinch device as an advanced EUVL light source. In this thrust a program of advanced materials mirrors compatible with θ-pinch concept.
Figure 2:
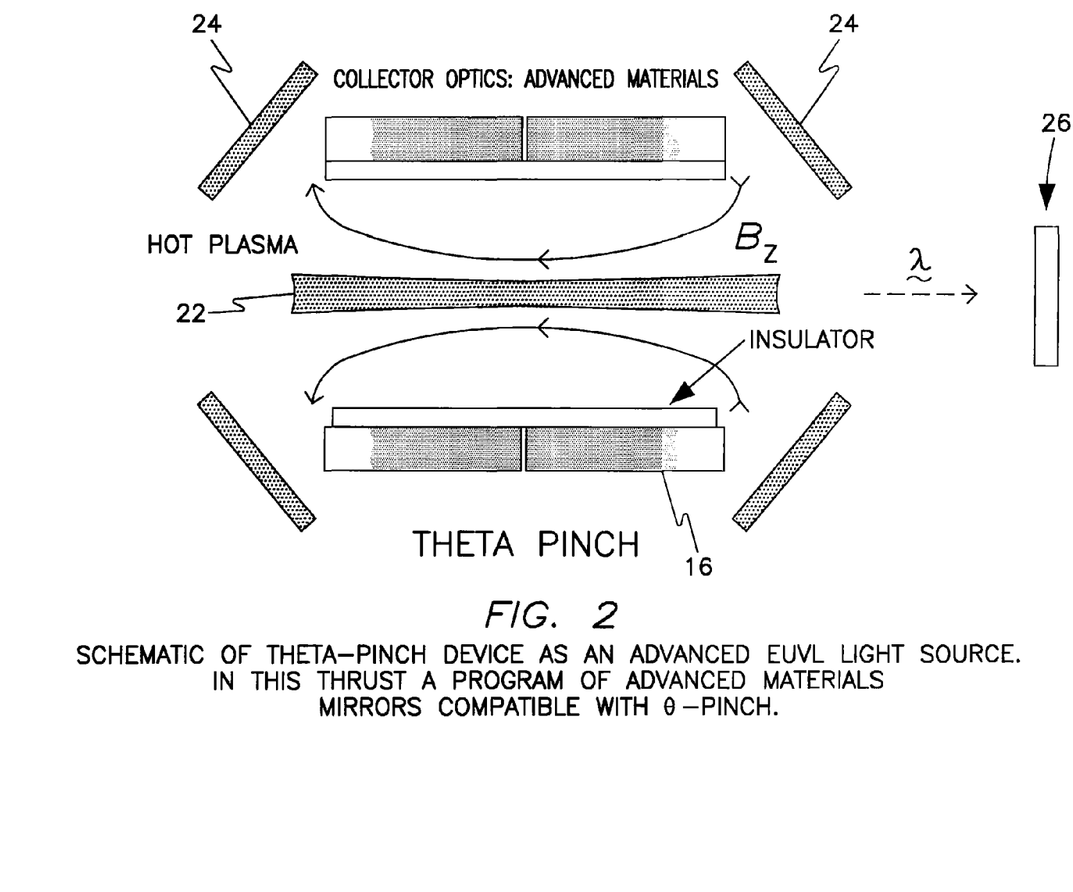
FIG. 2 is a schematic illustration of external circuit and current flow for theta-pinch concept.

The θ-pinch EULV generating device of this invention is shown generally at 10 in FIG. 1 and FIG. 2. An electric circuit 12 provides power to the magnetic field generating mechanism 14 with coils 16. The magnetic field B 18 induces current component J within plasma generating zone 20. The plasma generating zone 20 contains a suitable gas, such as xenon, vaporized tin or vaporized lithium. The magnetic field B required to generate the temperature and currents of the this device is typically on the order of from about 7.5 kilo Gauss (kG) to about 10 kG (One Tesla). The resulting plasma 22 exists at a temperature from about 20 eV to about 40 eV. The hot plasma 22 generated by the magnetic field created by the flowing electric current accelerates the electrons and ions in the plasma into a tiny volume with sufficient energy to cause substantial stripping of outer electrons from the ions and a consequent production of x-rays and high energy ultraviolet radiation. The extremely short-wave ultraviolet electromagnetic. wavelength light (EULV) produced by this device is from about 10 nm to about 20 nm and preferably about 13.5 nm. Mirrors 24, as shown in FIG. 2 direct and focus the extreme short-wave ultraviolet electromagnetic wavelength light, which is then directed to the material to be exposed 26. Alternatively, separate mirrors and focusing assemblies may be used.

An advantage of a theta-pinch (θ-pinch) device is the absence of electrodes due to the current being induced by the magnetic field of a cylindrical coil, as schematically illustrated in FIG. 1 and FIG. 2. This advantage is critical in addressing component lifetime limitations by conventional EUVL source configurations (e.g., dense plasma focus, Z-pinch). Therefore, the theta-pinch concept is not only advanced but quite innovative in being able to realize the high power necessary for HVM.

The second main advantage is that the heated and compressed dense plasma flows along the system axis (in z-direction) which can be directed away from sensitive components thus protecting theta-pinch plasma-facing components such as insulators. Both factors can result in much less erosion of PFCs and therefore, much longer lifetime needed for high-power HVM. Ultimately this innovative source could prove the key to operating EUVL source systems with throughputs of the order of about 100 wafers/hour or more. These factors can result in much less erosion of plasma facing surfaces (PFCs) and therefore, much longer component lifetimes.

Yet a third advantage of the (θ-pinch) device is its inherent stability compared to other configurations such as the Z-pinch. This is due to the θ-pinch equilibrium having no parallel currents so that current-driven modes cannot be excited. Likewise, since the field lines are straight, their curvature is zero (i.e., radius of curvature is infinite) and pressure-driven modes cannot be excited. Any perturbation to the equilibrium (in a θ-pinch) either bends or compresses the magnetic field lines, and both are stabilizing influences. This is an advantageous characteristic since plasma stability plays a major role in EUVL device performance, thus making a θ-pinch EUV device highly dependable for HVM performance. These factors result in much less erosion of plasma facing surfaces (PFCs) and therefore, much longer component lifetimes.

Quantitative Details of the θ-Pinch

Let us consider a θ-pinch device with parameters similar to z-pinch devices of similar power/capability: $C_0$=2.0 μF, $L_0$=10 nH, $U_0$=10 kV.

$$\tau = 2\pi\sqrt{C_0 L_0} = 1 \mu s,$$

$$f = \frac{1}{\tau} = 1 \text{ MHz}, \omega = 2\pi f = 6.28 \text{ MHz}$$

$$q = C_0 U_0 = 2 \cdot 10^{-2} \text{ Coulomb}, I_0 = q\omega = 125 \text{ kA}$$

$$Q_0 = \frac{C_0 U_0^2}{2} = 100 \text{ J}$$

Inductance of a θ-pinch device, $L_{c0}$, is less than outer circuit inductance $L_0$ $$L_c = L_{c0}\pi\left(1 - \frac{r^2}{R_0^2}\right), L_{c0} = 4\pi \cdot 10^{-2}\frac{\pi R_0^2}{l}$$

$L_{c0}$=0.6 nH<$L_0$=10 nH

The maximum magnetic field, $B_0$, and the corresponding magnetic pressure, $P_\mu$, are given by $$B = 10^{-1} \cdot \pi\frac{I}{l} = \approx 10 \text{ kG}, P_\mu = \frac{B_0^2}{8\pi} = 5 \text{ atm}$$

At the end of the heating process due to the Joule heating and compression at time $t \approx \tau/4$ plasma pressure, P, becomes close to the magnetic pressure, $P_\mu$, $$P = (1+z)nkT, n = \frac{P}{(1+z)kT} = 1.25 \cdot 10^{16} \text{ cm}^{-3}$$

The lifetime of the θ-pinch plasma is determined by flow along axis with velocity close to the thermal one. Thus, the desired line radiation output $Q_\theta(\lambda=13.5 \text{ nm})$ is $$Q_\theta = n_e n_i f(T)\pi R^2 l\tau_{life}, Q_\theta = \frac{f(T)}{V_{Ti}}\pi z R_\theta^2 N_\theta^2,$$

$$\tau_{life} = \frac{l_\theta}{V_{Ti}}, V_{Ti} = \sqrt{\frac{3}{2}\frac{kT}{m}}, N_\theta = n_\theta l_\theta$$

The lifetime of plasma-focus plasma is determined by not well-understood or well-characterized electro-dynamical processes. For a Cymer-type facility, $\tau_{life} = \tau_Z = 20$ ns, therefore, radiation output is $$Q_z = zN_z^2 f(T)\pi R_z^2 \frac{\tau_z}{l_z}, N_z = n_z l_z$$

The ratio, $\xi$, between $Q_\theta$ and $Q_z$ is $$\xi = \frac{Q_\theta}{Q_z} = \left(\frac{R_\theta}{R_z}\right)^2 \left(\frac{N_\theta}{N_z}\right)^2 \frac{l_z}{V_{Ti}\tau_z}$$

For $n_z \approx 10^{18}$ cm$^{-3}$, $l_z \approx 0.01$ cm, $R_z \approx 0.01$ cm, $V_{Ti}=20$ km/s, $\tau_z=20$ ns, $N_z=10^{16}$ cm$^{-2}$ $$\xi = (R_\theta N_\theta)^2 \frac{1}{4 \cdot 10^{31}}$$

To have $\xi > 1$ the following parameters are necessary $$n_\theta = 1.35 \cdot 10^{16} \text{ cm}^{-3}, l_\theta = \frac{l}{2} = 3 \text{ cm},$$

$N_\theta = 4 \cdot 10^{16}$, cm$^{-2}$, $R_\theta > 0.16$, cm

The total energy in plasma column is $$E_{total} = k\varepsilon n\pi R_\theta^2 l = 0.2 \text{ J}, \varepsilon = \frac{3}{2}T(1+Z) + \int_0^Z I(z)dz[\text{eV}] = 640 \text{ eV}$$

The compression ratio can be less than $\eta = R_0/R_\theta \leq 20$ for increasing the total energy $E_{total}$. Nevertheless, even at lower efficiency of energy deposition into plasma column, output radiation can be more than dense plasma focus devices. In plasma-focus devices and for first half-period about 40% of energy is dissipated. In contrast with plasma-focus energy dissipation in theta-pinch is very small because most of energy is stored in magnetic field. This energy is not lost if the electric circuit is switched off at $t=\tau/2$ when the current equal to zero and all energy returns back to capacitor.

Control of the θ-Pinch Contour

Figure 3:
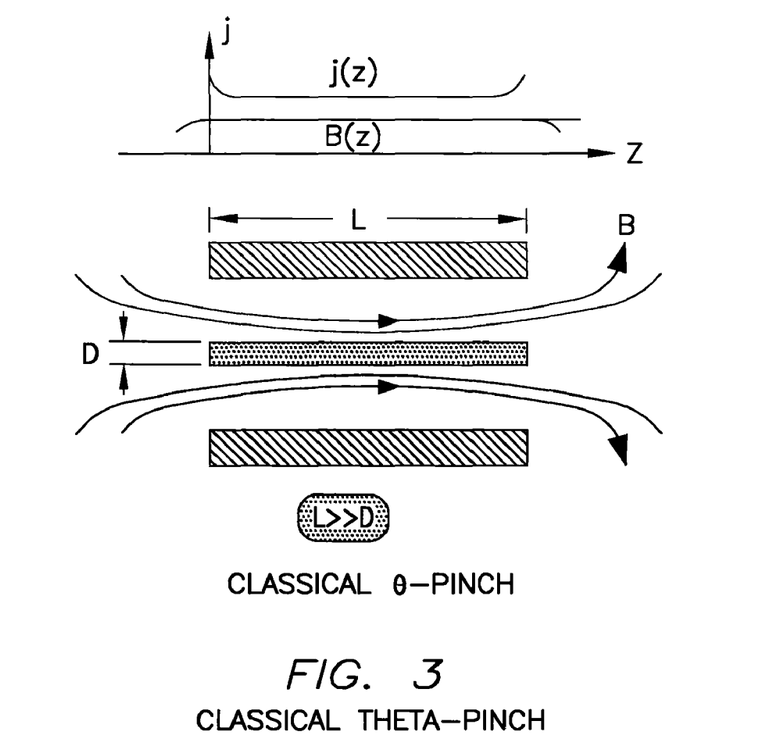
FIG. 3. is a schematic of a classical theta-pinch.

The classical θ-pinch has the form of a cylinder with diameter D=2R that is much less than its length L. Current density determining magnetic field $B_z$ is practically homogeneous except at edges with some increasing of j and decreasing B, as shown in FIG. 3.

Figure 4:
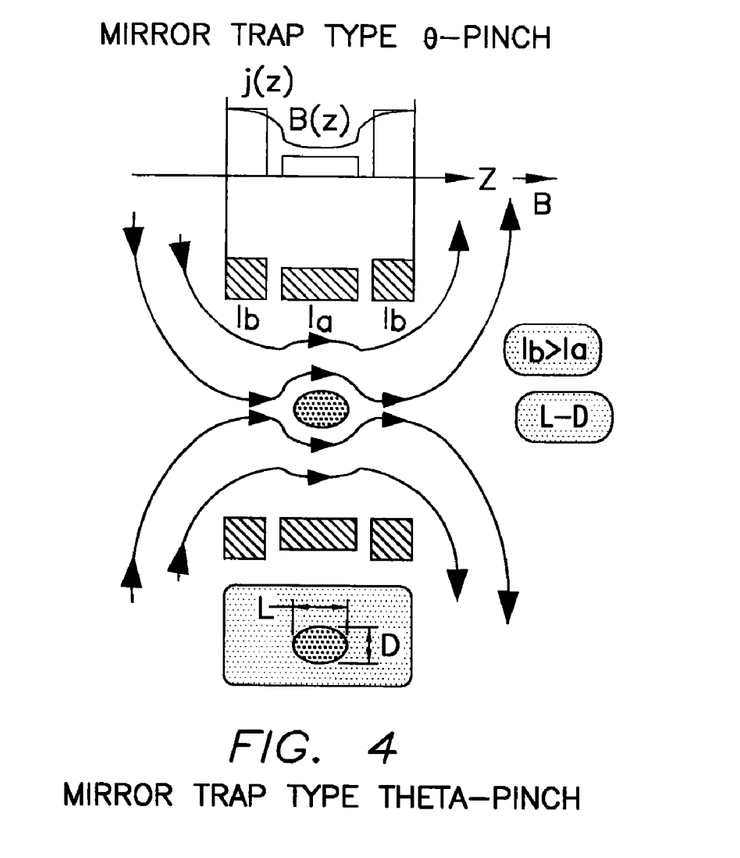
FIG. 4. is a schematic of the Mirror trap type theta-pinch of this invention.

However, the dependence of the current density, j (z), on coordinate, z, can be arbitrary if one uses coils in the form of several rings, k, carrying different currents, 1 (k). FIG. 4 shows, for example, a three ring system and is plotted having the current of the rings 1 and 3, $1_b$, is more than the current of ring 2 being in the middle. Such current and distance between rings can be chosen such that current density strongly increased toward edges by certain degree. Therefore, the magnetic field at the edges of plasma cloud (elliptical form close to spherical in this case) determined by the edge rings will be equal to magnetic field at surface of cloud $B_{surface}$. $B_{surface}$ can be larger than magnetic field at the same place due to expelling of magnetic flux by the plasma cloud. Actually it is a well known distribution of magnetic field named as "magnetic trap configuration". Such system with plasma is named as "mirror trap" where plasma is confined by magnetic field increasing from center toward edges.

Figure 5:
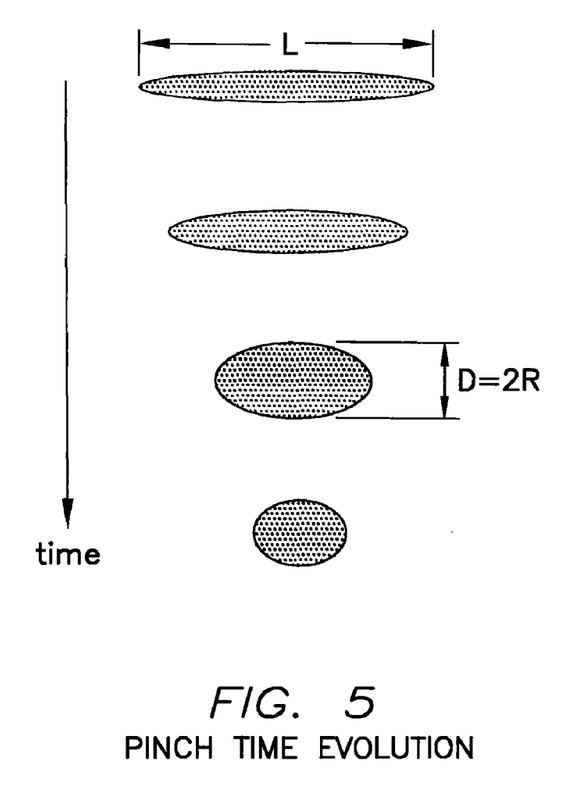
FIG. 5. Pinch time evolution

In FIG. 5 different shapes of plasma pinch as a function of time is plotted. For such behavior, a programmed time dependence of current is necessary. The current in central ring increases as $I_a(t) = I_{ao}\sin(\omega t),$ however, the current in the edge ring should increases with a delay of $t_0$ $$I_b(t) = I_{ao}\sin(\omega t) + I_{add}$$

$$I_{add} = (I_{bo} - I_{ao})\sin(\omega t - \omega t_0) \text{ at } t > t_0$$

$$I_{add} = 0 \text{ at } t < t_0$$

Thus, at initial time $t<t_0$ more or less homogeneous plasma cylinder is formed with decreasing radius, R (t), due to compression. After time $t>t_0$, the increase in edge current results in pushing of plasma toward the cylinder center. Therefore, plasma cloud shape becomes more and more spherical. At certain dependence of current $l_b(t)$ corresponding to coincidence of radial compression time, $\tau_\perp$, and axial driven out time, $\tau_{//}$, one can achieve spherical shape of final plasma pinch.

In summary, the advantages, as shown in Table 1 of a theta-pinch EUV device include: no electrodes, longer plasma lifetime, high plasma stability, flexible plasma size, wider angle for collectable radiation (can collect in 4 π!), and axial plasma flow after pinching which can be diverted away from sensitive components for much longer components lifetime.

TABLE 1

Comparison between Z- and θ-Pinch Devices

| Parameters | Z-Pinch/DPF | θ-Pinch |
| --- | --- | --- |
| Electric Circuit | Similar | similar |
| Deposited Energy in Plasma | Same | Same |
| Pinch Geometry & Size | Similar aspect ratio | Similar aspect ratio |
| EUV Output | Similar UV per pulse | Similar UV per pulse |
| Radiation Collection | Solid angle, $\Omega \approx 2\pi$ | Solid angle, $\Omega \approx 4\pi$ ++ |
| Mirror Location | Depends on design | More flexible + |
| Mirror Erosion & Lifetime | Plasma expands spherically Significant contamination − | Plasma expands along Z Little contamination ++ |
| Electric Energy Efficiency | More energy dissipated in circuit − | More energy recovered from the B-field ++ |
| Erosion of Internal Components | Electrodes lifetime is a major problem −− | No electrodes and plasma expands along Z ++ |
| Operational Experience | Many Devices Exists + | No Device Exists for EUV − |

Thus, in accordance with the invention, there has been provided a method and apparatus for generating electromagnetic radiation in the range of 13.5 nm that does not degrade or erode the electrode material is needed. An additional objection of this invention is to provide.

There has also been provided a method and apparatus which eliminates the need for an electrode in the light generation process.

With this description of the invention in detail, those skilled in the art will appreciate that modification may be made to the invention without departing form the spirit thereof. Therefore, it is not intended that the scope of the invention be limited to the specific embodiments that have been illustrated and described. Rather, it is intended that the scope to the invention be determined by the scope of the appended claims.

We claim:

1. A device for generating/producing an extremely short-wave ultraviolet electromagnetic wave without electrodes, comprising:
    an axially aligned open-ended pinch chamber defining a plasma zone adapted to contain a plasma generating gas within the plasma zone;
    means for generating a magnetic field radially outward of the open-ended pinch chamber compressing the plasma to produce a discharge plasma from the plasma generating gas, thereby producing a electromagnetic wave in the extreme ultraviolet range;
    collecting means in optical communication with the pinch chamber to collect the electromagnetic radiation;
    and focusing means in optical communication with the collecting means to concentrate the electromagnetic radiation.

2. The device for generating/producing extremely short-wave ultraviolet electromagnetic wave of claim 1 wherein the plasma generating gas is selected from the group consisting of xenon, vaporized tin and vaporized lithium.

3. The device for generating/producing extremely short-wave ultraviolet electromagnetic wave of claim 1 wherein the means for generating the magnetic field will produce a magnetic field of from about 7.5 kG to about 10 kG.

4. The device for generating/producing extremely short-wave ultraviolet electromagnetic wave of claim 1 wherein plasma is generated at a temperature from about 20 eV to about 40 eV.

5. The device for generating/producing extremely short-wave ultraviolet electromagnetic wave of claim 1 wherein the extremely short-wave ultraviolet electromagnetic wavelength is from about 10 nm to about 20 nm.

6. The device for generating/producing extremely short-wave ultraviolet electromagnetic wave of claim 1 wherein the extremely short-wave ultraviolet electromagnetic wavelength is about 13.5 nm.

7. A method for generating/producing extremely short-wave ultraviolet electromagnetic wave without the use of electrodes, comprising: providing an open-ended pinch chamber defining a plasma zone; providing a plasma generating gas within the plasma zone; generating a magnetic field radially outward of the open-ended pinch chamber compressing the plasma to produce a discharge plasma from the plasma generating gas, thereby producing a electromagnetic wave in the extreme ultraviolet range, said electromagnetic wave emanating from the ends of the plasma zone; and collecting/focusing the electromagnetic wave emanating from the ends of the pinch chamber to collect the electromagnetic radiation.

8. The method for generating/producing extremely short-wave ultraviolet electromagnetic wave without the use of electrodes of claim 7, further comprising focusing the electromagnetic wave to provide a coherent beam of electromagnetic radiation.

9. The method for generating/producing extremely short-wave ultraviolet electromagnetic wave without the use of electrodes of claim 7, wherein the plasma generating gas is selected from the group consisting of xenon, vaporized tin and vaporized lithium.

10. The method for generating/producing extremely short-wave ultraviolet electromagnetic wave without the use of electrodes of claim 7, wherein the magnetic field generated is from about 7.5 kG to about 10 kG.

11. The method for generating/producing extremely short-wave ultraviolet electromagnetic wave without the use of electrodes of claim 7, wherein plasma is generated at a temperature from about 20 eV to about 40 eV.

12. The method for generating/producing extremely short-wave ultraviolet electromagnetic wave without the use of electrodes of claim 7, wherein the extremely short-wave ultraviolet electromagnetic wavelength is from about 10 nm to about 20 nm.

13. The method for generating/producing extremely short-wave ultraviolet electromagnetic wave without the use of electrodes of claim 7, wherein the extremely short-wave ultraviolet electromagnetic wavelength is about 13.5 nm.

* * * * *